United States Patent

Renz et al.

[11] Patent Number: 5,828,010
[45] Date of Patent: Oct. 27, 1998

[54] CONNECTION OF ELECTRICALLY CONDUCTING LAYERS WITH CERAMIC PROMINENCES

[75] Inventors: Hans-Joerg Renz, Leinfelden-Echterdingen; Harald Neumann, Vaihingen/Enzwethingen; Johann Riegel, Bietigheim-Bissingen, all of Germany

[73] Assignee: Robert Bosch GmbH, Stuttgart, Germany

[21] Appl. No.: 360,711

[22] PCT Filed: Apr. 13, 1994

[86] PCT No.: PCT/DE94/00406

§ 371 Date: Dec. 21, 1994

§ 102(e) Date: Dec. 21, 1994

[87] PCT Pub. No.: WO94/24838

PCT Pub. Date: Oct. 27, 1994

[30] Foreign Application Priority Data

Apr. 21, 1993 [DE] Germany .............................. 4312976.5

[51] Int. Cl.⁶ ...................................................... H01R 9/09
[52] U.S. Cl. .............................. 174/261; 361/790; 156/89
[58] Field of Search ...................... 361/781, 777, 361/785, 792, 795, 780, 744, 790; 439/66, 47; 174/261, 255; 156/89, 291; 428/901

[56] References Cited

U.S. PATENT DOCUMENTS 4,555,285  11/1985  Chance et al. .............................. 156/89
4,847,003  7/1989   Palanisamy .............................. 252/514
5,245,135  9/1993   Schreiber et al. ....................... 174/261
5,587,885  12/1996  Swamy .................................... 361/777

FOREIGN PATENT DOCUMENTS 0 379 736   8/1990   European Pat. Off. .
2 204 940   5/1974   France .
2 003 375   8/1970   Germany .
88 01469    2/1988   WIPO .

OTHER PUBLICATIONS

IBM Technical Disclosure Bulletin, vol. 22, No. 2, Jul., 1979, "Low–Cost Stacked Module", Rasile et al., pp. 525–526.

Primary Examiner—Bot L. Ledynh
Assistant Examiner—Kamand Cuneo
Attorney, Agent, or Firm—Spencer & Frank

[57] ABSTRACT

A connection between electrically conducting layers (11, 14, 21) extending in at least two layer levels is proposed, between which at least one ceramic foil (10) is arranged. The ceramic foil has a connection (13) from the one layer level to the other layer level. A contact point (23) is provided in at least one layer level which is located outside of the connection (13) and which is formed by at least one pressure contact (10, 20) formed on an electrically conducting layer (14, 21) during lamination.

8 Claims, 1 Drawing Sheet

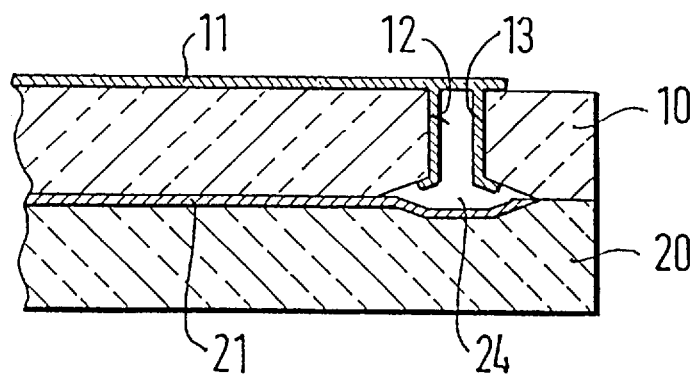
FIG. 1
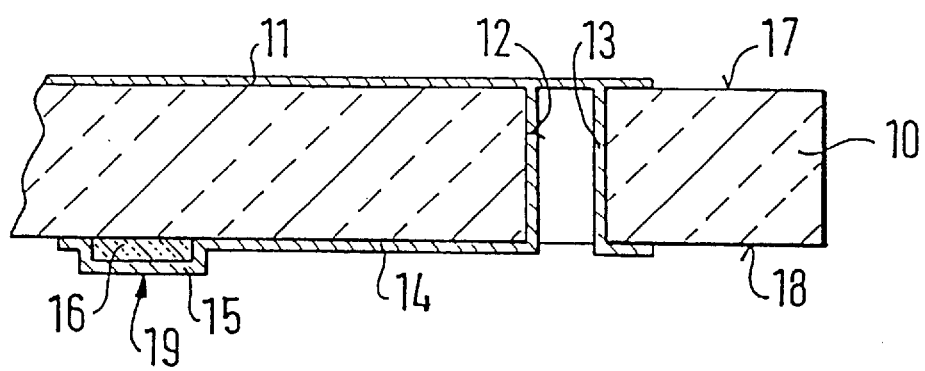
FIG. 2a
FIG. 2b
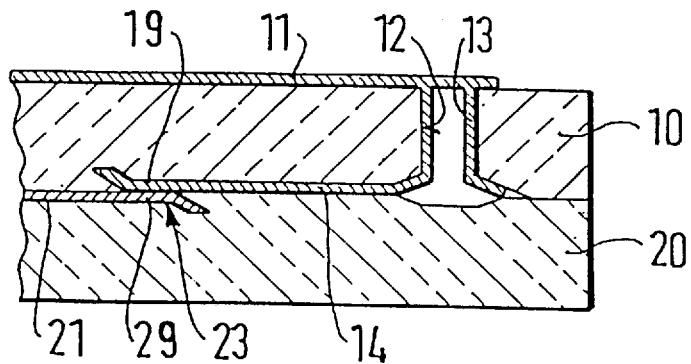
FIG. 3

5,828,010

1
CONNECTION OF ELECTRICALLY CONDUCTING LAYERS WITH CERAMIC PROMINENCES

STATE OF THE ART

The invention relates to the connection of electrically-conducting layers of a layer system wherein the electrically conducting layers extend in at least two layer levels or planes between which at least one ceramic foil is arranged, and wherein a through connection or contact between the conductors of one layer level or plane to those of the other layer level or plane extends or has been cut through the ceramic foil. In addition to electronic circuits, layered structures which are created by imprinting, stacking and laminating ceramic foils are increasingly employed in sensor technology, for example with gas sensors. With such laminated structures it is often necessary to connect conducting layers, for example strip conductors, through a ceramic foil to the next following foil. To connect strip conductors through a ceramic foil, it is customary to fill connecting holes (vias), which are either stamped, drilled or created by a laser, completely or partially with an electrically conductive paste. The continuous electrical connection is created where a strip conductor extends at this point on the next following foil, if both foils are laminated so they are accurately fitted with an even surface pressure. However, since ceramic foils can be plastically deformed, the material of the ceramic foils yields in the area of the edges and the connecting hole, so that the laminating pressure is reduced in this area.

The end result of this is that following sintering it is possible that the laminated bond between the two ceramic foils as well as the electrical connection can be disrupted at the place of the connecting hole or is interrupted by alternating thermal stresses.

SUMMARY AND ADVANTAGES OF THE INVENTION

The above discussed problem according to the prior art is overcome according to the present invention by a connection arrangement of electrically conducting layers extending in at least two layer levels or planes, between which at least one ceramic foil is arranged, wherein a connection between the one layer level to the other layer level has been cut through the ceramic foil, and a contact point, which is located outside the connection, is provided in at least one layer level.

In contrast to one prior art, the connection in accordance with the invention has the advantage that a permanent electrical connection is maintained during operation, for example with alternating thermal stress, even after sintering of the layer system. The contact point has been placed into the area of a defined lamination pressure, so that following sintering a homogeneous laminated bond between the two ceramic foils is created.

Advantageous further embodiments and features of the basic connection according to the invention are possible are disclosed. A particularly good electrical connection is achieved when both layers to be connected each have a raised surface at the contact point so that a snap fastener-like connection is created.

BRIEF DESCRIPTION OF THE DRAWINGS

An exemplary embodiment of the invention is shown in the drawings and explained in detail in the subsequent description. FIG. 1 shows a layer system in accordance with the state of the art with an electrical connection between two strip conductors after sintering, FIG. 2a shows a first foil of a layer system with a connecting point formed, FIG. 2b shows a second ceramic foil, also with a connecting point, and associated with the first ceramic foil in accordance with FIG. 2a, and FIG. 3 shows the ceramic foils of FIGS. 2a and 2b in the laminated and sintered state.

DETAILED DESCRIPTION OF THE PREFERRED EMBODIMENTS

A layer system with a connection in accordance with the state of the art is shown in FIG. 1, wherein the layer system consists of a first ceramic foil 10 and a second ceramic foil 20. A first strip conductor 11 is arranged on the first foil 10 as the electrically conducting layer. A hole 12 is provided in the foil 10, through which a connection 13 is guided which connects the first strip conductor 11 with a second strip conductor 21, wherein the second strip conductor 21 is a further electrically conductive layer arranged on the second foil 20. It can be seen in FIG. 1 that the foils 10, 20 have a gap 24 under the connection 13, which interrupts the connection between the strip conductors 11 and 21.

FIGS. 2a, 2b and 3 show an exemplary embodiment of the invention. Here the strip conductor 11 arranged on a large surface 17 of the first foil 10 is extended by means of the connection 13 through the hole 12 as far as the other large surface 18 of the first ceramic foil 10. A strip conductor section 14 is arranged on the large surface 18 which is brought back in the direction of the first strip conductor 11, for example, and which has a first raised surface 15 on the large surface 18. The raised surface 15 extends, for example, over the entire width of the strip conductor section 14, so that a first pressure contact 19 is formed. For making the pressure contact 19, a first prominence 16 is provided on the large surface 18 as the pressure layer, which is for example made from the material of the foil 10. Finally, the strip conductor section 14 is placed over the prominence 16, so that the pressure contact 19 with the said raised surface 15 is formed at this place.

In accordance with FIG. 2b, the second strip conductor 21 is arranged on the large surface 27 of the second foil 20 facing the large surface 18 of the first foil 10. The second strip conductor 21 is designed with a second raised surface 25 opposite the first raised surface 15. In this case the second raised surface 25 also extends over the entire width of the strip conductor 21, for example, so that a second pressure contact 29 is formed. To provide the second raised surface 25 in the same way as in connection with the first raised surface 15, a second prominence 26 is provided on the large surface 27 of the foil 20, over which the second strip conductor 21 is finally passed. Here, too, the prominence 26 consists of the material of the foil 20, for example. The large surface 27 of the second ceramic foil 20 is furthermore provided with a bonding layer 22, wherein the bonding layer 22 is recessed for the raised surface 26 of the second strip conductor 21. However, the bonding layer 22 can be applied in the same way on the first foil 10 or on both foils 10, 20.

The layer system laminated from the two foils 10 and 20 of FIGS. 2a and 2b and sintered and with a contact point 23 can be seen in FIG. 3. FIG. 3 makes clear that, as in FIG. 1, the gap 24 between the two foils 10 and 20 occurs in the area of the hole 12 because of the effects of lamination and sintering. The connection between the first and second strip conductors 11 and 21 is created by the first pressure contact 19 and the second pressure contact 29 being pressed together by the laminating pressure when the two ceramic foils 10 and 20 are laminated together. A high pressure is exerted on the contact point 23 by moving the contact point 23 out of the area of the hole 12, because of which the two pressure contacts 19 and 29 are joined in the manner of a snap fastener.

The two foils 10 and 20 consist, for example, of zirconium oxide. The strip conductors 11 and 21 are, for example, made of a cermet material applied by a screen printing process. A strip conductor or electrode material, for example, used with oxygen sensors, consists of PT cermet with a support frame made from the ceramic material of the adjoining ceramic foil. It is conceivable in the same way to connect appropriate electrodes or other electrically conducting layers with each other instead of the strip conductor 11, 21. As a rule the pressure used in laminating ceramic foils is 500 to 2000 N/cm$^2$, and the sintering temperature, depending on the foil type, 800° to 1500° C., for example. The described layer system can also be used in connection with other multilayer systems, for example, when producing electronic circuits.

We claim:

1. A connection arrangement comprising electrically conducting layers extending in at least two layer levels, at least one ceramic foil arranged between said at least two layer levels, a connection between the electrically conducting layer of one of the layer levels to the electrically conducting layer of another of the layer levels extending through the ceramic foil, and a contact point located outside the connection provided on at least one of the at least two layer levels; and wherein at least one of the electrically conducting layers has a raised surface at the contact point; and, at the contact point the ceramic foil has a prominence, consisting of the material of the ceramic foil, over which said at least one of the electrically conducting layers is passed, so that the raised surface is produced.

2. A connection arrangement in accordance with claim wherein the contact point is arranged in an area of the at least one of the at least two layer levels of to which a high laminating pressure can be applied.

3. A connection arrangement in accordance with claim 1, wherein at least one additional conducting layer section is connected to said at least one of the electrically conducting layers in an area of the prominence.

4. A connection arrangement in accordance with claim 1, wherein an electrically conducting layer section is provided from the connection to the contact point and extends on the at least one ceramic foil, and the electrically conducting layer on the another of the layer levels extends on a further ceramic foil.

5. A connection arrangement in accordance with claim 4 wherein: the ceramic foils with all of the electrically conducting layers are laminated to form an electrical connection at the contact point; both the electrically conducting layer section extending on the at least one ceramic foil and the electrically conducting layer extending on the further foil have a raised portion at the contact point; a layer supporting the lamination is applied on at least one of the at least one and the further ceramic foils at said at least one of the layer levels having the contact point; and, an area of the contact point is recessed relative to the surface of the layer supporting the lamination which is closest to the at least one ceramic foil.

6. A connective substrate arrangement comprising:

a plurality of adjacent laminated ceramic foils;

first and second strip conductors disposed on respective first and second opposite surfaces of at least a first ceramic foil of the plurality of ceramic foils, and a third strip conductor disposed on a facing surface of a second ceramic foil of said plurality of ceramic foils which faces said second surface of said first ceramic foil;

a conductive connection extending through an opening in said first ceramic foil and electrically connecting said first and second strip conductors;

a contact point between said second and third conductors, with said contact point being laterally spaced from said opening through said first ceramic foil, and being disposed between said first and second ceramic foils and within said substrate; and, at least one of said second surface of said first ceramic foil and said facing surface of said second ceramic foil has a prominence at the contact point of the same material as the respective ceramic foil over which the associated one of the second and third strip conductors passes to form a raised portion of the associated one of the second and third strip conductors at the contact point.

7. The arrangement according to claim 6 further including an insulation layer disposed between said first and second ceramic foils except at said contact point.

8. The arrangement according to claim 7 wherein:

each of said second and said facing surfaces has a prominence at said contact point over which the associated second and third strip conductors passes to form a pair of raised portions; and, said insulation layer has an opening at said contact point to receive the pair of raised portions of said second and third strip conductors.

* * * * *